United States Patent
Jacobs

(10) Patent No.: US 11,345,589 B2
(45) Date of Patent: May 31, 2022

(54) SELECTIVE GETTERING THROUGH PHASE SEGREGATION AND TEMPERATURE DEPENDENT STORAGE AND RELEASE STRUCTURE FOR LUBRICANT

(71) Applicant: TEXAS INSTRUMENTS INCORPORATED, Dallas, TX (US)

(72) Inventor: Simon Joshua Jacobs, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/728,309

(22) Filed: Dec. 27, 2019

(65) Prior Publication Data

US 2020/0207610 A1  Jul. 2, 2020

Related U.S. Application Data

(60) Provisional application No. 62/786,400, filed on Dec. 29, 2018.

(51) Int. Cl.
*B81B 7/00* (2006.01)
*B81C 1/00* (2006.01)

(52) U.S. Cl.
CPC ........ *B81B 7/0038* (2013.01); *B81C 1/00285* (2013.01)

(58) Field of Classification Search
CPC .................. B81C 1/00285; B81B 7/0038
See application file for complete search history.

(56) References Cited

U.S. PATENT DOCUMENTS

| | | | | |
|---|---|---|---|---|
| 6,203,869 B1* | 3/2001 | Dougherty | ............... | H01L 23/26 428/35.7 |
| 6,300,294 B1* | 10/2001 | Robbins | ................ | B81B 3/0075 427/384 |
| 2007/0172991 A1* | 7/2007 | Schaadt | ................... | H01L 23/10 438/123 |
| 2008/0160268 A1* | 7/2008 | Jacobs | ................... | B81B 3/0075 428/212 |
| 2010/0068474 A1* | 3/2010 | Sauer | ................. | B01J 20/28033 428/195.1 |
| 2012/0024722 A1* | 2/2012 | Chen | ........................ | H01L 21/56 206/204 |
| 2012/0325091 A1* | 12/2012 | Caplet | ................... | B81B 7/0038 96/154 |

* cited by examiner

*Primary Examiner* — Herve-Louis Y Assouman
(74) *Attorney, Agent, or Firm* — Michelle F. Murray; Charles A. Brill; Frank D. Cimino

(57) ABSTRACT

A microelectronic device package includes a host material and a gettering material. The microelectronic device package also includes a polymeric component between the host material and the gettering material. The polymeric component substantially encapsulates the gettering material. The microelectronic device package further includes a fluorochemical lubricant. The polymeric component serves to prevent a reaction between the fluorochemical lubricant and the gettering material. Alternatively, the fluorochemical lubricant may be encapsulated by a polymeric component and may be released upon an increase in temperature during or after a packaging step.

32 Claims, 3 Drawing Sheets

SELECTIVE GETTERING THROUGH PHASE SEGREGATION AND TEMPERATURE DEPENDENT STORAGE AND RELEASE STRUCTURE FOR LUBRICANT

CROSS-REFERENCE TO RELATED APPLICATION(S)

This application claims priority to U.S. Provisional Application No. 62/786,400, filed Dec. 29, 2018, which is hereby incorporated by reference.

BACKGROUND

Several components within a package headspace of a microelectromechanical systems (MEMS) device may be harmful to the device or cause performance degradation over time, while other components may be helpful or necessary to ensure reliable operation over time. In the case of a digital light processing (DLPe) spatial light modulator, or Digital Micromirror Device (DMD), certain fluorochemical lubricants (such as perfluoroalkanoic acid, perfluorosulfonic acid, perfluoroalkylene oxide terminated by a polar functional group such as carboxylic acid, sulfonic acid, or phosphonic acid) within the package headspace are important for reliable operation, while water and certain organic compounds (e.g., aldehydes) which may also be present within the package headspace can lead to performance degradation, especially in the presence of UV light during operation of the device. The performance degradation can be in the form of photochemical degradation of the package headspace chemistry, leading to a variety of residue defects. Current gettering material techniques do not allow chemical gettering of water or aldehydes because the lubricant also reacts with the gettering material.

SUMMARY

In one aspect, a microelectronic device package includes a host material and a gettering material. The microelectronic device package also includes a polymeric component between the host material and the gettering material. The polymeric component substantially encapsulates the gettering material. The microelectronic device package further includes a fluorochemical lubricant. The polymeric component serves to prevent a reaction between the fluorochemical lubricant and the gettering material.

In another aspect, a method of preventing a reaction within a microelectronic device package includes forming a microelectronic device package and positioning a host material within the microelectronic device package. The method also includes disposing a gettering material substantially encapsulated by a polymeric component within the microelectronic device package. The polymeric component is between the host material and the gettering material. The method further includes placing a fluorochemical lubricant within the microelectronic device package. The polymeric component serves to prevent a reaction between the fluorochemical lubricant and the gettering material.

In yet another aspect, a microelectronic device package includes a host material, a gettering material, and a fluorochemical lubricant. The microelectronic device package also includes a polymeric component between the host material and the fluorochemical lubricant. The polymeric component substantially encapsulates the fluorochemical lubricant. The polymeric component serves to prevent a reaction between the gettering material and the fluorochemical lubricant.

In yet another aspect, a method of preventing a reaction within a microelectronic device package includes forming a microelectronic device package and positioning a host material within the microelectronic device package. The method also includes placing a gettering material within the microelectronic device package and disposing a fluorochemical lubricant substantially encapsulated by a polymeric component within the microelectronic device package. The polymeric component is between the host material and the fluorochemical lubricant. The polymeric component serves to prevent a reaction between the gettering material and the fluorochemical lubricant.

In a further aspect, a method of fabricating a microelectronic device package includes forming a microelectronic device package and positioning a host material within the microelectronic device package. The method also includes placing a gettering material within the microelectronic device package and disposing a fluorochemical lubricant substantially encapsulated by a polymeric component within the microelectronic device package within an environment at a first temperature. The polymeric component is between the host material and the fluorochemical lubricant. The polymeric component serves to prevent a reaction between the gettering material and the fluorochemical lubricant at the first temperature. The method further includes increasing the temperature of the environment to a second temperature higher than the first temperature. The second temperature is above a critical temperature to achieve miscibility of the polymeric component and the fluorochemical lubricant, or above a melting temperature of the polymeric component to allow release of the fluorochemical lubricant from within the encapsulation.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

For purposes of this description, the phrase "substantially encapsulates" is defined to include at least 95% encapsulation. For example, a polymeric component substantially encapsulating a gettering material means that at least 95% of an outer surface of a gettering material is encapsulated by a polymeric component. Similarly, a polymeric component substantially encapsulating a fluorochemical lubricant means that at least 95% of an outer surface of a fluorochemical lubricant is encapsulated by a polymeric component.

Aspects of this description isolate a gettering material from a fluorochemical lubricant by encapsulating the gettering component in a polymer matrix in which the lubricant component is insoluble/immiscible or only difficultly soluble at high temperatures. The encapsulant prevents contact between the gettering component and the lubricant. The other headspace components are soluble in the encapsulant matrix and thus can diffuse through and react with a reactive getter, removing them from the headspace.

Another advantage of employing the encapsulant is to stop or slow the reaction between the gettering component and a host polymer (e.g., PVB) as well as between the gettering component and the atmosphere during device fabrication. This strategy enables the use of chemically reactive gettering materials vs. those that work purely by absorption or adsorption.

An additional optional component (second getting material) of the gettering system is one which removes the byproducts of chemical reactions between the (first) gettering material and the headspace constituents. An example of a second gettering material may be a hydrogen getter.

Figure 1:
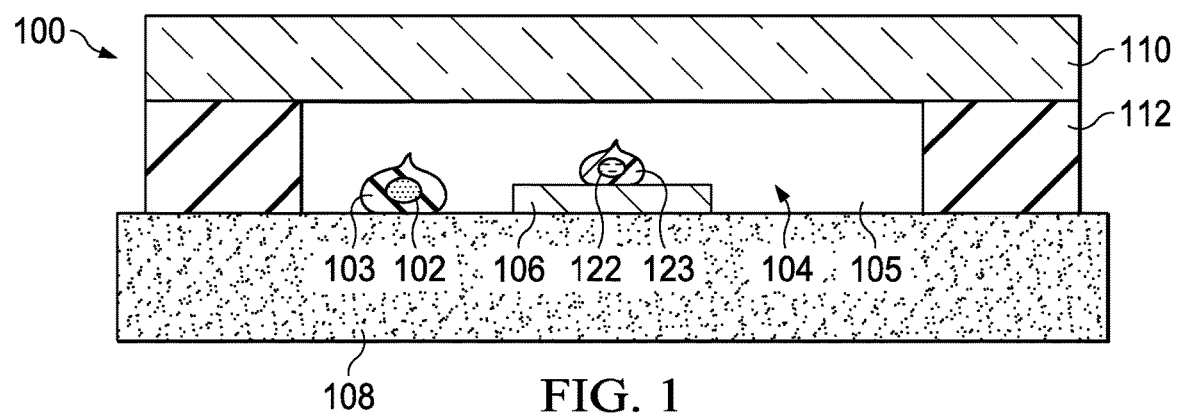
FIG. 1 is a cross-sectional side view of a microelectronic device package.

With reference to FIG. 1, shown is a cross-sectional side view of a microelectronic device package 100. The microelectronic device package 100 includes a package substrate 108 (e.g., comprising silicon or glass), a package lid or window 110, a spacer ring 112, and an interior headspace 104 which is considered the interior portion of the microelectronic device package 100. An microelectronic device 106, such as a digital light processing (DLP®) spatial light modulator or Digital Micromirror Device (DMD), is contained with the headspace 104. A gettering material 102 (and gettering material encapsulant 103) and a fluorochemical lubricant 122 (and fluorochemical lubricant encapsulant 123) are also positioned within the headspace 104. As shown in FIG. 1, both the gettering material 102 and the fluorochemical lubricant 122 are encapsulated. However, in aspects, only the gettering material 102 may be encapsulated within the headspace 104, or only the fluorochemical lubricant 122 may be encapsulated within the headspace 104. A polymer host material 105 (e.g., polyvinyl butyral (PVB)) is further contained within the headspace 104. An optional second gettering material 152 (comprised of, for example, a material which absorbs $H_2$) may be encapsulated by a second gettering material encapsulant 153 comprised of the same composition as that of the gettering material encapsulant 103 or another composition. FIG. 1 shows only one encapsulated gettering material and one encapsulated fluorochemical lubricant, but these elements (with encapsulants) may be provided in multiple as per FIG. 2 and FIG. 3. The encapsulated gettering material and the encapsulated fluorochemical lubricant may be positioned in any locations within the headspace 104.

With further detail, the microelectronic device package 100 includes the microelectronic device 106 mounted within the headspace 104, and an optical window 110 is sealed to by means of a spacer-ring 112. The gettering material and fluorochemical lubricant are included within the headspace 104. Due to out-gassing and such, there is any number of gas constituents present in the headspace 104 within the package and around the surface of the microelectronic device 106. Where the microelectronic device 106 is a DMD, illumination flux enters the DMD along a first light path at an off-axis angle through the window 110. This light is then modulated by means of the DMD and then the light is reflected out of the window 110 along a second light path. For visible light, this has proven to be a reliable structure, which provides long, lifetime devices. Usually, the optically clear borosilicate glass window is coated with an anti-reflective (AR) coating to prevent reflections from occurring and, therefore, to give higher optical performance. However, for UV-illuminated applications, there can be a photochemical activation between the UV flux and the headspace gas chemistries (chemistries for surface electrostatic and stiction problems resulting from hydration, surface tension, tribology, and any number of other effects) that become reactive, generating volatile radicals that are damaging to the surface of the DMD device and the inside surface of the borosilicate glass window.

Fluorochemical lubricants such as those used in a DMD are typically immiscible and insoluble, or at best only slightly soluble, in certain hydrocarbons due to the difference in polarization of the C—F bonds of the former and C—H bonds of the latter. It is therefore possible to encapsulate a gettering material for water and/or organic materials within a cavity or microsphere of hydrocarbon polymer, wax, or other polymeric material and prevent or substantially slow the reaction between the gettering material and the fluorochemical lubricant, while providing only a diffusion-related retardation of the reaction rate with the other materials in the package which are to be removed by the gettering reaction. Additionally, this encapsulation makes the gettering material compatible with a wide variety of host polymers which may be part of the formulation of a gettering material or getter paste. Finally, other gettering materials (e.g., second gettering material 252 in FIG. 2 discussed below) may be present in order to produce other desired behavior such as rapid response to changes in headspace conditions or the absorption/adsorption of byproducts of one or more gettering reactions (e.g., resulting from use of the first gettering material 202 in FIG. 2 discussed below). These additional gettering materials may or may not be encapsulated as the situation warrants. Specific examples of gettering materials which may be encapsulated include, but are not limited to: partial or complete anhydrides of inorganic acids, such as boric acid (boric oxide, metaboric acid, etc.), phosphoric acid (phosphorous pentoxide, metaphosphoric acid, polyphosphoric acid, etc.); reducing agents, such as borohydrides, complex aluminum hydrides, alane derivatives, etc.; hydride bases such as potassium hydride, lithium hydride, etc.; alkali metals or their alloys; zeolite molecular sieves; other chemical drying agents. Suitable encapsulating polymers include those which will not react with the gettering material and have desirable thermomechanical performance over the range of temperatures anticipated. Examples of such encapsulating materials include, but are not limited to: hydrocarbon waxes, polyethylene, polypropylene, polystyrene, rubber, etc. In some cases, polyamides may also be used with success, although the phase segregation will not be as great due to the amphiphilic nature of the polymer. Suitable encapsulating techniques include but are not limited to: melt encapsulation, microbubble encapsulation, latex encapsulation, etc. For instance, in melt encapsulation, the gettering material and the encapsulating material (i.e., the gettering material encapsulant) are mixed at a temperature above $T_m$, the melting temperature of the encapsulating material, creating an intimate mixture wherein particles or agglomerates of the gettering material are substantially covered or coated by the encapsulating material. Such mixture is then quenched by dispersion in a fluid medium at a temperature below $T_m$, providing particles or agglomerates which may then be harvested by standard techniques such as filtration or centrifugation.

An additional advantage of encapsulation of the gettering material is that the rate of reaction of the gettering material with the surrounding environment during packaging operations is dramatically slowed, thus retaining its gettering capacity for maximizing device lifetime or other desired goals.

Present gettering systems do not take advantage of the phase segregation between hydrocarbon and fluorocarbon phases to slow or prevent reaction between the fluorochemical component and the gettering component. Aspects of this description allow selective removal of certain harmful or undesired compounds within the headspace while slowing or preventing reaction with the lubricant materials. The result is a cleaner headspace which provides a more robust device with higher reliability.

Figure 2:
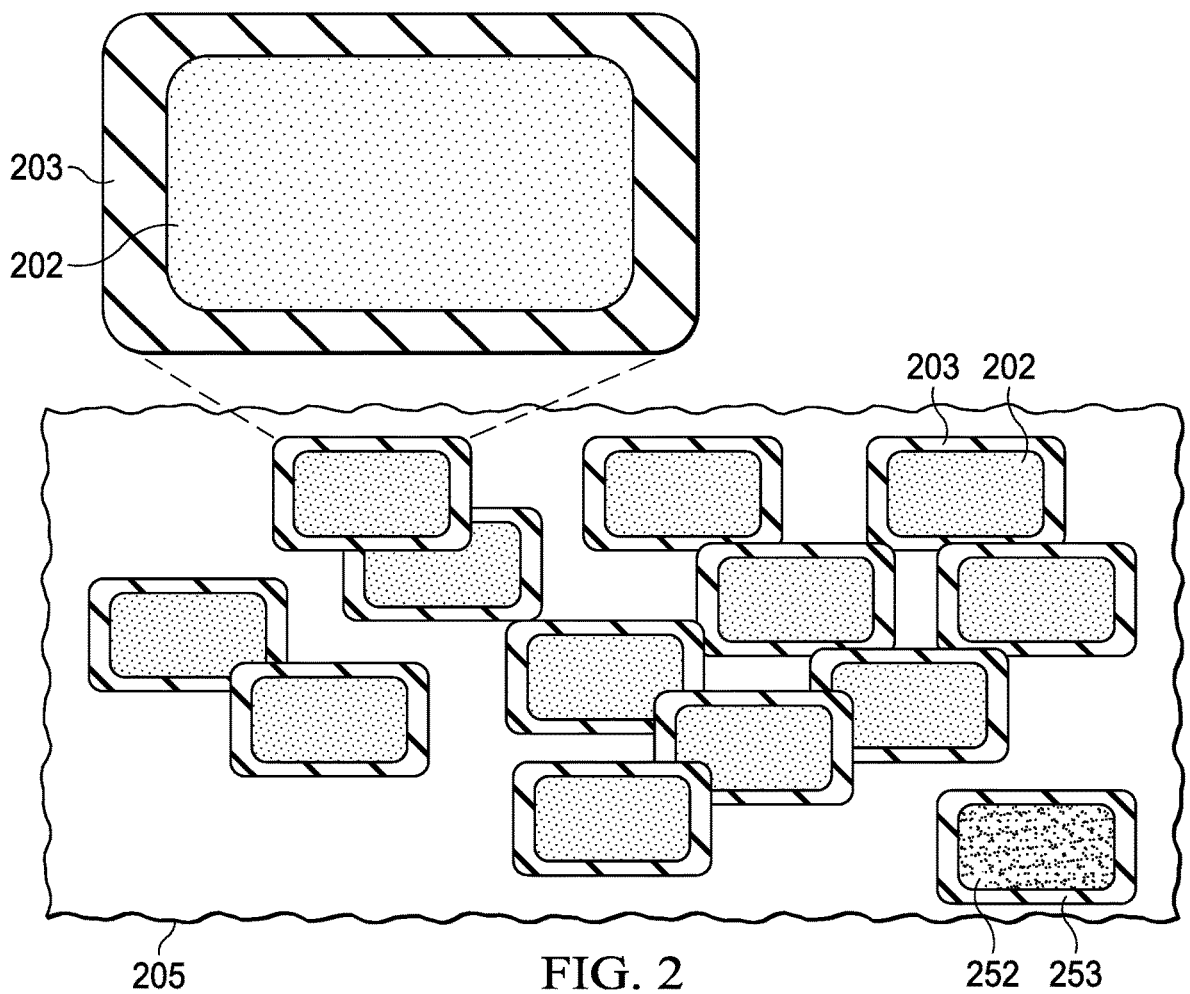
FIG. 2 is a partially enlarged view of an encapsulated gettering material within a polymer host material, in accordance with this description.

With reference to FIG. 2, shown is a partially enlarged view of an encapsulated gettering material (i.e., a gettering material 202 and surrounding gettering material encapsulant 203). Multiple encapsulated gettering materials are shown in the figure within a polymer host material 205. Also shown in the figure are an optional second gettering material 252 and surrounding second gettering material encapsulant 253.

Several components within a headspace of a MEMS device may have deleterious interactions with a fluorochemical lubricant during the packaging process. In the case of a DLP® spatial light modulator or DMD, certain fluorochemical acids are important to the reliable operation of the device, but these acids may prematurely react with certain packaging materials, such as active metals, during the packaging process, leading to formation of unwanted reaction products. Aspects of this description provide a method for keeping the flourochemical lubricant segregated from the contents of the headspace during the packaging process while allowing the fluorochemical lubricant to be released at a later desired time.

Fluorochemical lubricants such as those used in DMDs are typically immiscible and insoluble, or at best only slightly soluble, in certain hydrocarbons due to the difference in polarization of the C—F bonds of the former and C—H bonds of the latter. It is therefore possible to encapsulate a fluorochemical lubricant material within a cavity or microsphere of hydrocarbon polymer, wax, or other polymeric material, and prevent or substantially slow the release of the fluorochemical lubricant at normal temperatures. After the packaging process is substantially complete, or during the final sealing procedure or other prior fabrication process step, raising the temperature above the "critical temperature" ($T_c$) for the miscibility of the polymer and fluorochemical lubricant and/or above the melting temperature ($T_m$) of the polymer, the lubricant may then be released. Specifically considered polymers include high-density polyethylene (HDPE) and polypropylene (PP) due to the high $T_c$ with fluorocarbons.

Present gettering systems do not take advantage of the phase segregation between hydrocarbon and fluorocarbon phases to slow or prevent release of a lubricant component until a desired stage of the packaging process. Aspects of this description allow selective application of the lubricant while minimizing or avoiding reactions of the lubricant with a material or layer that may be present at low temperature during intermediate packaging steps, such as a reactive metal.

Figure 3:
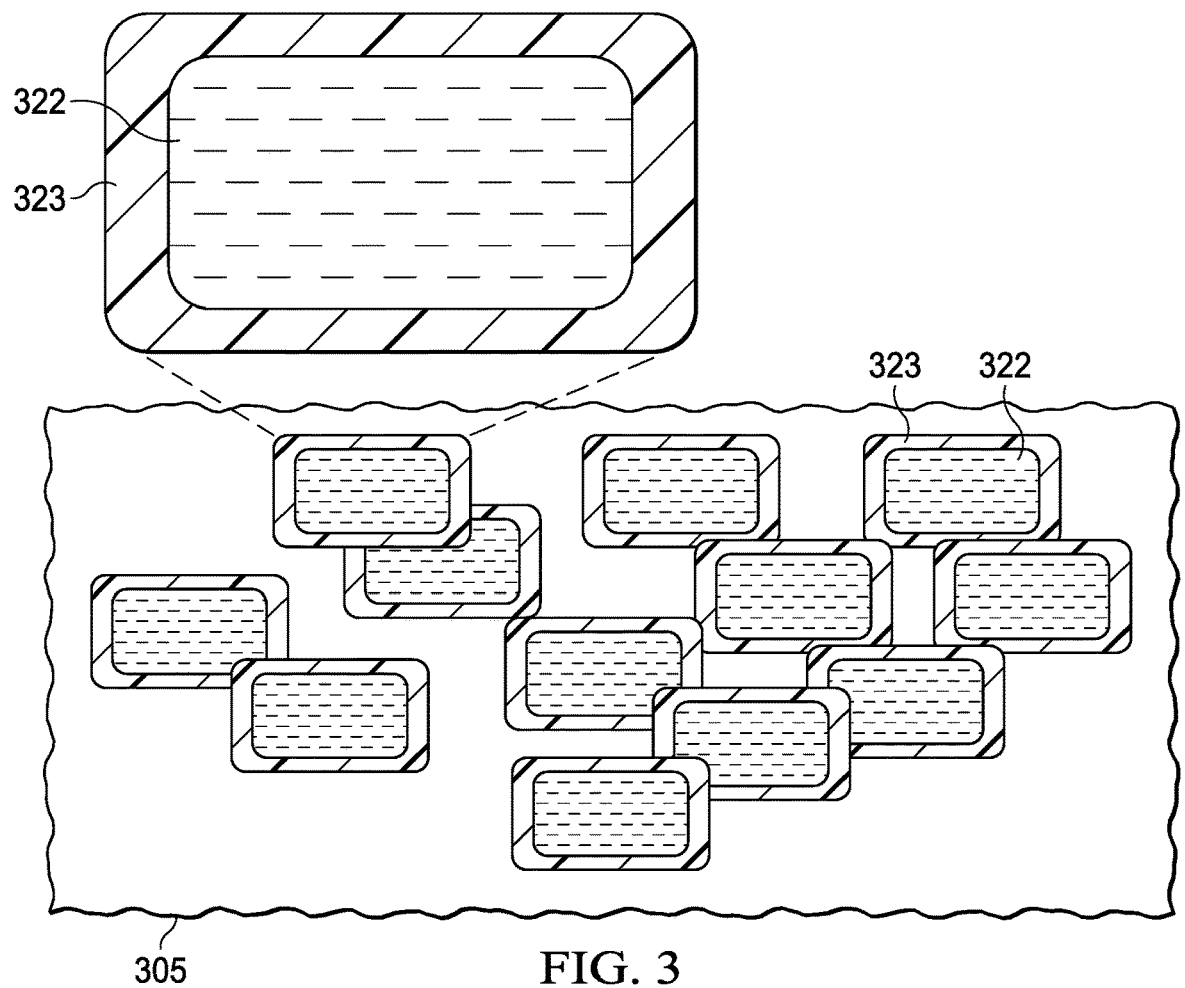
FIG. 3 is a partially enlarged view of an encapsulated fluorochemical lubricant within a polymer host material, in accordance with this description.

With reference to FIG. 3, shown is a partially enlarged view of an encapsulated fluorochemical lubricant (i.e., a fluorochemical lubricant 322 and surrounding fluorochemical lubricant encapsulant 323). Multiple encapsulated fluorochemical lubricants are shown in the figure within a polymer host material 305.

The encapsulant for either the gettering material or the fluorochemical lubricant may be comprised of the same polymeric component or different polymeric components from each other (i.e., in the case where the gettering material and the fluorochemical lubricant both are encapsulated within the same headspace). The encapsulation techniques mentioned in this description may be employed for encapsulating the gettering material and/or the fluorochemical lubricant.

Exemplary critical temperatures for a Hydrocarbon/fluorochemical (in this case fluorocarbon) mix. Note that as the polymer gets longer, $T_c$ goes up as indicated in Table 1 below.

TABLE 1

Exemplary critical temperatures for a Hydrocarbon/fluorocarbon mix

| Fluorocarbon | Hydrocarbon | $T_c$ (° K.) |
|---|---|---|
| $C_6F_{14}$ | $C_7H_{16}$ | 316 |
| $C_6F_{14}$ | $C_8H_{18}$ | 335.4 |
| $C_6F_{14}$ | $C_9H_{20}$ | 353.6 |
| $C_6F_{14}$ | $C_{10}H_{22}$ | 370 |
| $C_6F_{14}$ | $C_{11}H_{24}$ | 387.5 |
| $C_6F_{14}$ | $C_{12}H_{26}$ | 404 |
| $C_6F_{14}$ | $C_{13}H_{28}$ | 424.2 |
| $C_6F_{14}$ | $C_{14}H_{30}$ | 442.7 |
| $C_6F_{14}$ | $C_{15}H_{32}$ | 478.8 |
| $C_6F_{14}$ | $C_{16}H_{34}$ | 468.9 |
| $C_6F_{14}$ | $C_{17}H_{36}$ | 463 |
| $C_6F_{14}$ | $C_{18}H_{38}$ | 461.2 |
| cy-$C_6F_{12}$ | cy-$C_6H_{12}$ | 280.7 |
| $C_7F_{16}$ | $C_5H_{12}$ | 282.3 |
| $C_7F_{16}$ | $C_6H_{14}$ | 302 |
| $C_7F_{16}$ | 3-$CH_3C_5H_{11}$ | 292 |
| $C_7F_{16}$ | 2,2-$(CH_3)_2C_4H_8$ | 273 |
| $C_7F_{16}$ | 2,3-$(CH_3)_2C_4H_8$ | 283 |
| $C_7F_{16}$ | $C_7H_{16}$ | 323 |
| $C_7F_{16}$ | $C_8H_{18}$ | 341 |
| $C_7F_{16}$ | 2,2,4-$(CH_3)_3C_5H_9$ | 297 |
| $C_7F_{16}$ | $C_9H_{20}$ | 359.8 |
| $C_7F_{16}$ | $C_{10}H_{22}$ | 377.6 |
| $C_7F_{16}$ | $C_{11}H_{24}$ | 394 |
| $C_7F_{16}$ | $C_{12}H_{26}$ | 413.7 |
| $C_7F_{16}$ | $C_{13}H_{28}$ | 429.7 |
| $C_7F_{16}$ | $C_{14}H_{30}$ | 446.2 |
| $C_7F_{16}$ | $C_{15}H_{32}$ | 467.2 |
| $C_7F_{16}$ | $CCl_4$ | 332 |
| $C_7F_{16}$ | $SnCl_4$ | 370 |
| $C_7F_{16}$ | $CHCl_3$ | 352 |
| $C_7F_{16}$ | $C_6H_6$ | 387 |
| $C_7F_{16}$ | $(CH_3)_8(SiO)_4$ | 343 |
| $C_8F_{18}$ | $C_6H_{14}$ | 306.8-310 |
| $C_8F_{18}$ | $C_7H_{16}$ | 326 |
| $C_8F_{18}$ | $C_8H_{18}$ | 348.5 |
| $C_8F_{18}$ | iso-$C_8H_{18}$ | 300 |
| $C_8F_{18}$ | $C_{13}H_{28}$ | 426.3 |

Table 2 below sets forth exemplary glass transition and melting points for candidate polymers (i.e., polymeric component for the encapsulants).

TABLE 2

Exemplary glass transition and melting points for candidate polymers.

| Polymer | $T_g$ (° C.) | $T_m$ (° C.) |
|---|---|---|
| High density polyethylene (HDPE) | −110 | 135 |
| Polypropylene (PP) | −10 | 175 |

In one aspect, a microelectronic device package includes a host material and a gettering material. The microelectronic device package also includes a polymeric component disposed between the host material and the gettering material. The polymeric component substantially encapsulates the gettering material. The microelectronic device package further includes a fluorochemical lubricant. The polymeric component serves to prevent a reaction between the fluorochemical lubricant and the gettering material.

In an example, the gettering material is a first gettering material. The microelectronic device package further includes a second gettering material. The second gettering material is capable of removing a byproduct of a reaction involving the first gettering material. The polymeric component may be a first polymeric component. The second gettering material may be substantially encapsulated by a second polymeric component. The second polymeric component serves to prevent a reaction between the fluorochemical lubricant and the second gettering material. The second gettering material may include a hydrogen getter.

Figure 4:
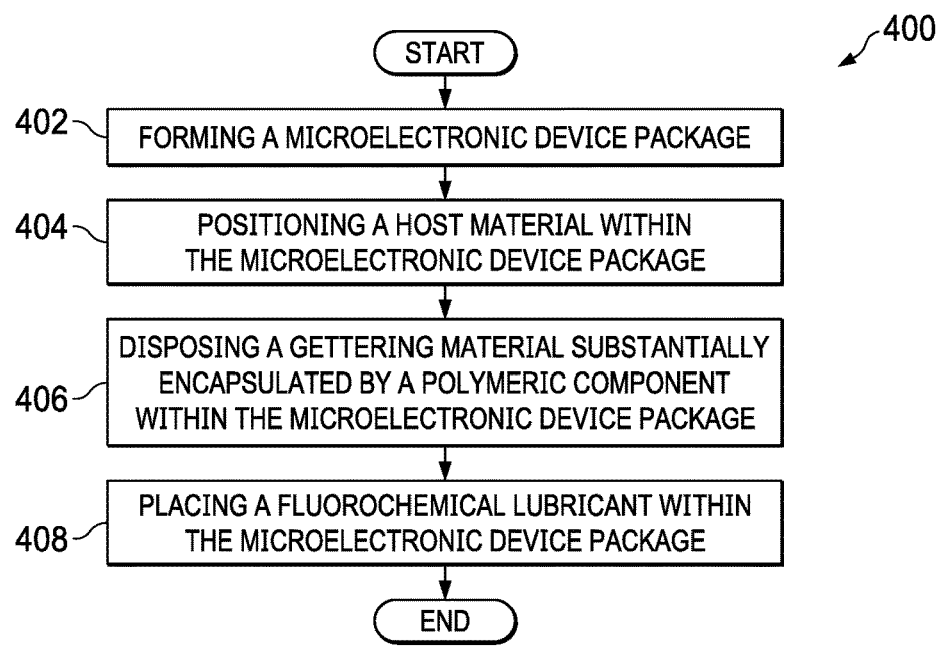
FIG. 4 is a flowchart illustrating a method of preventing a reaction within a microelectronic device package, in accordance with this description.

With reference to FIG. 4, in another aspect, a method 400 of preventing a reaction within a microelectronic device package includes forming a microelectronic device package (block 402) and positioning a host material within the microelectronic device package (block 404). The method 400 also includes disposing a gettering material substantially encapsulated by a polymeric component within the microelectronic device package (block 406). The polymeric component is disposed between the host material and the gettering material. The method 400 further includes placing a fluorochemical lubricant within the microelectronic device package (block 408). The polymeric component serves to prevent a reaction between the fluorochemical lubricant and the gettering material.

In an example, the gettering material is a first gettering material. The method further includes disposing a second gettering material within the microelectronic device package. The second gettering material is capable of removing a byproduct of a reaction involving the first gettering material. The polymeric component may be a first polymeric component. The second gettering material may be substantially encapsulated by a second polymeric component. The second polymeric component serves to prevent a reaction between the fluorochemical lubricant and the second gettering material. The second gettering material may include a hydrogen getter.

In an example of any of the microelectronic device package or methods involving the encapsulated gettering material: the host material includes at least one material selected from the group consisting of polyvinyl butyral (PVB), hydroxypropyl cellulose (HPC), poly(vinyl pyrrolidone) (PVP), any other host polymer described in U.S. Pat. No. 6,843,936 issued to Jacobs (such host polymers hereby incorporated herein by reference), and combinations thereof; the gettering material includes at least one material selected from the group consisting of anhydrides of inorganic acids, phosphoric acid, reducing agents, hydride bases, alkali metals, alkali metal alloys, reactive metals, reactive metal hydrides, inorganic salts, zeolite molecular sieves, and combinations thereof; the polymeric component includes at least one material selected from the group consisting of high-density polyethylene (HDPE), polypropylene (PP), polystyrene (PS), hydrocarbon polymer, hydrocarbon waxes, rubber, polyamides, and combinations thereof; and/or the fluorochemical lubricant includes perfluorinated alkyl or perfluorinated polyalkylene oxide tail, and a polar head group.

In yet another aspect, a microelectronic device package includes a host material and a fluorochemical lubricant. The microelectronic device package also includes a polymeric component disposed between the host material and the fluorochemical lubricant. The polymeric component substantially encapsulates the fluorochemical lubricant. The polymeric component serves to prevent a reaction involving the fluorochemical lubricant. The microelectronic device package may optionally further include a gettering material. The polymeric component may further serve to prevent a reaction between the gettering material and the fluorochemical lubricant.

Figure 5:
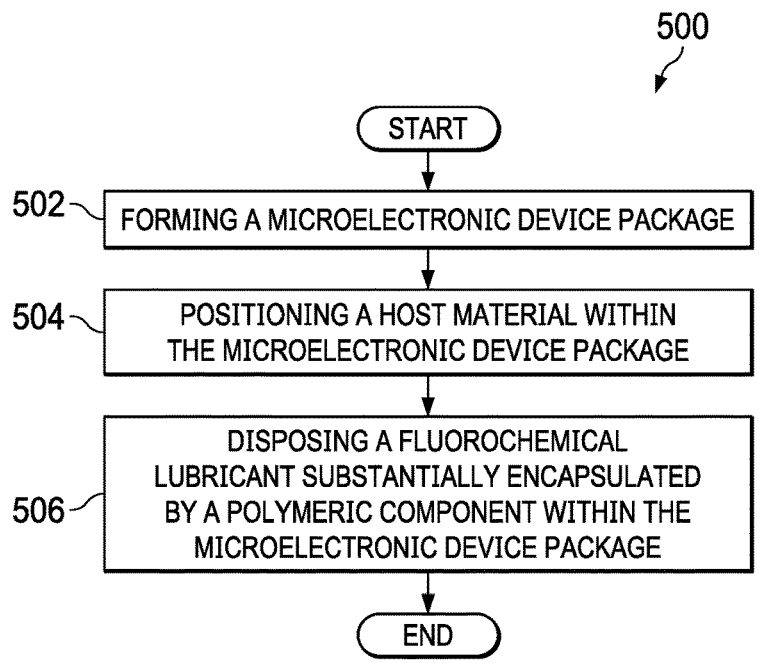
FIG. 5 is a flowchart illustrating another method of preventing a reaction within a microelectronic device package, in accordance with this description.

With reference to FIG. 5, in yet another aspect, a method 500 of preventing a reaction within a microelectronic device package includes forming a microelectronic device package (block 502) and positioning a host material within the microelectronic device package (block 504). The method 500 also includes disposing a fluorochemical lubricant substantially encapsulated by a polymeric component within the microelectronic device package (block 506). The polymeric component is disposed between the host material and the fluorochemical lubricant. The polymeric component serves to prevent a reaction involving the fluorochemical lubricant. The method 500 may optionally further include placing a gettering material within the microelectronic device package. The polymeric component may further serve to prevent a reaction between the gettering material and the fluorochemical lubricant.

Figure 6:
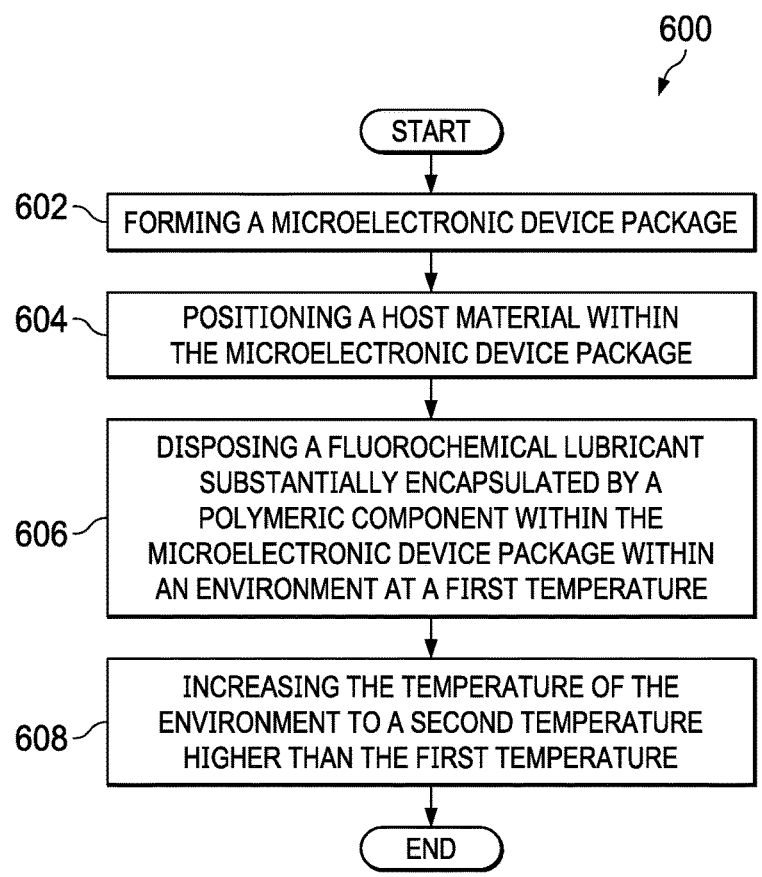
FIG. 6 is a flowchart illustrating a method of fabricating a microelectronic device package, in accordance with this description.

With reference to FIG. 6, in a further aspect, a method 600 of fabricating a microelectronic device package includes forming a microelectronic device package (block 602) and positioning a host material within the microelectronic device package (block 604). The method 600 also includes disposing a fluorochemical lubricant substantially encapsulated by a polymeric component within the microelectronic device package within an environment at a first temperature (block 606). The polymeric component is disposed between the host material and the fluorochemical lubricant. The polymeric component serves to prevent a reaction involving the fluorochemical lubricant at the first temperature. The method 600 further includes increasing the temperature of the environment to a second temperature higher than the first temperature (block 608). The second temperature is above a critical temperature to thereby achieve miscibility of the polymeric component and the fluorochemical lubricant, or above a melting temperature of the polymeric component to thereby allow release of the fluorochemical lubricant from within the encapsulation. The first temperature is preferably within a range of 20-80° C., and the second temperature is above the first temperature (e.g., 20° C. or more higher than the first temperature). The method 600 may optionally further include placing a gettering material within the microelectronic device package. The polymeric component may further serve to prevent a reaction between the gettering material and the fluorochemical lubricant at the first temperature.

In an example of any of the microelectronic device package or methods involving the encapsulated fluorochemical lubricant: the optional gettering material, if present, includes at least one material selected from the group consisting of anhydrides of inorganic acids, phosphoric acid, reducing agents, hydride bases, alkali metals, alkali metal alloys, reactive metals, reactive metal hydrides, inorganic salts, zeolite molecular sieves, and combinations thereof; the polymeric component includes at least one material selected from the group consisting of high-density polyethylene (HDPE), polypropylene (PP), polystyrene (PS), hydrocarbon polymer, hydrocarbon waxes, rubber, polyamides, and combinations thereof; and/or the fluorochemical lubricant includes perfluorinated alkyl or perfluorinated polyalkylene oxide tail, and a polar head group.

The method steps in any of the examples described herein are not restricted to being performed in any particular order. Also, structures mentioned in any of the method examples may utilize structures mentioned in any of the device examples. Such structures may be described in detail with respect to the device examples only but are applicable to any of the method examples.

Features in any of the examples described in this description may be employed in combination with features in other examples described herein, and such combinations are considered to be within the spirit and scope of the present disclosure.

Modifications are possible in the described embodiments, and other embodiments are possible, within the scope of the claims.

What is claimed is:

1. A microelectronic device package comprising:
   a polymer host material;
   a gettering material within the polymer host material;
   a polymer encapsulant between the polymer host material and the gettering material; and
   a fluorochemical lubricant within the polymer host material, the polymer encapsulant between the gettering material and the fluorochemical lubricant.

2. The microelectronic device package of claim 1, wherein the polymer host material comprises polyvinyl butyral (PVB), hydroxypropyl cellulose (HPC), or poly (vinyl pyrrolidone) (PVP).

3. The microelectronic device package of claim 1, wherein the gettering material comprises anhydrides of inorganic acids, phosphoric acid, reducing agents, hydride bases, alkali metals, alkali metal alloys, reactive metals, reactive metal hydrides, inorganic salts, or zeolite molecular sieves.

4. The microelectronic device package of claim 1, wherein the polymer encapsulant comprises high-density polyethylene (HDPE), polypropylene (PP), polystyrene (PS), hydrocarbon polymer, hydrocarbon waxes, rubber, or polyamides.

5. The microelectronic device package of claim 1, wherein the fluorochemical lubricant comprises perfluorinated alkyl or perfluorinated polyalkylene oxide tail, and a polar head group.

6. The microelectronic device package of claim 1, wherein the gettering material is a first gettering material, the microelectronic device package further comprising a second gettering material, wherein the second gettering material is configured to remove a byproduct of a reaction involving the first gettering material.

7. The microelectronic device package of claim 6, wherein the polymer encapsulant is a first polymer encapsulant, wherein the second gettering material is substantially encapsulated by a second polymer encapsulant, and wherein the second polymer encapsulant is configured to prevent reaction between the fluorochemical lubricant and the second gettering material.

8. The microelectronic device package of claim 6, wherein the second gettering material comprises a hydrogen getter.

9. A method of fabricating a device, the method comprising:
   positioning a polymer host material within a microelectronic device package;
   disposing a gettering material within a polymer encapsulant within the polymer host material, wherein the polymer encapsulant is between the polymer host material and the gettering material; and
   disposing a fluorochemical lubricant within the polymer host material, the polymer encapsulant between the gettering material and the fluorochemical lubricant.

10. The method of claim 9, wherein the polymer host material comprises polyvinyl butyral (PVB), hydroxypropyl cellulose (HPC), or poly(vinyl pyrrolidone) (PVP).

11. The method of claim 9, wherein the gettering material comprises anhydrides of inorganic acids, phosphoric acid, reducing agents, hydride bases, alkali metals, alkali metal alloys, reactive metals, reactive metal hydrides, inorganic salts, or zeolite molecular sieves.

12. The method of claim 9, wherein the polymer encapsulant comprises density polyethylene (HDPE), polypropylene (PP), polystyrene (PS), hydrocarbon polymer, hydrocarbon waxes, rubber, or polyamides.

13. The method of claim 9, wherein the fluorochemical lubricant comprises perfluorinated alkyl or perfluorinated polyalkylene oxide tail, and a polar head group.

14. The method of claim 9, wherein the gettering material is a first gettering material, the method further comprises disposing a second gettering material within the microelectronic device package, wherein the second gettering material is configured to remove a byproduct of a reaction involving the first gettering material.

15. The method of claim 14, wherein the polymer encapsulant is a first polymeric component, wherein the second gettering material is substantially encapsulated by a second polymer encapsulant, and wherein the second polymer encapsulant is configured to prevent reaction between the fluorochemical lubricant and the second gettering material.

16. The method of claim 14, wherein the second gettering material comprises a hydrogen getter.

17. A microelectronic device package comprising:
   a polymer host material;
   a gettering material within the polymer host material;
   a fluorochemical lubricant within the polymer host material; and
   a polymer encapsulant between the polymer host material and the fluorochemical lubricant and between the fluorochemical lubricant and the gettering material.

18. The microelectronic device package of claim 17, wherein the polymer encapsulant is further configured to prevent reaction between the gettering material and the fluorochemical lubricant.

19. The microelectronic device package of claim 17, wherein the gettering material comprises inorganic acids, phosphoric acid, reducing agents, hydride bases, alkali metals, alkali metal alloys, reactive metals, reactive metal hydrides, inorganic salts, or zeolite molecular sieves.

20. The microelectronic device package of claim 17, wherein the polymer encapsulant comprises high-density polyethylene (HDPE), polypropylene (PP), polystyrene (PS), hydrocarbon polymer, hydrocarbon waxes, rubber, or polyamides.

21. The microelectronic device package of claim 17, wherein the fluorochemical lubricant comprises perfluorinated alkyl or perfluorinated polyalkylene oxide tail, and a polar head group.

22. A method of fabricating a device, the method comprising:
positioning a host material within a microelectronic device package;
disposing a gettering material within the host material; and
disposing a fluorochemical lubricant within a polymer encapsulant within the host material, wherein the polymer encapsulant is between the host material and the fluorochemical lubricant and between the fluorochemical lubricant and the gettering material.

23. The method of claim 22, wherein the polymer encapsulant is further configured to prevent reaction between the gettering material and the fluorochemical lubricant.

24. The method of claim 22, wherein the gettering material comprises of anhydrides of inorganic acids, phosphoric acid, reducing agents, hydride bases, alkali metals, alkali metal alloys, reactive metals, reactive metal hydrides, inorganic salts, or zeolite molecular sieves.

25. The method of claim 22, wherein the polymer encapsulant comprises high-density polyethylene (HDPE), polypropylene (PP), polystyrene (PS), hydrocarbon polymer, hydrocarbon waxes, rubber, or polyamides.

26. The method of claim 22, wherein the fluorochemical lubricant comprises perfluorinated alkyl or perfluorinated polyalkylene oxide tail, and a polar head group.

27. A method of fabricating a device, the method comprising:
positioning a host material within a microelectronic device package;
disposing a fluorochemical lubricant within a polymer encapsulant within the microelectronic device package in an environment at a first temperature, wherein the polymer encapsulant is between the host material and the fluorochemical lubricant, and wherein the polymer encapsulant is configured to prevent reaction involving the fluorochemical lubricant at the first temperature; and
increasing the temperature of the environment to a second temperature higher than the first temperature, wherein the second temperature is:
above a critical temperature for miscibility of the polymer encapsulant and the fluorochemical lubricant, or
above a melting temperature of the polymer encapsulant to release the fluorochemical lubricant from within the polymer encapsulant.

28. The method of claim 27, wherein the method further comprises placing a gettering material within the microelectronic device package, and wherein the polymer encapsulant is further configured to prevent reaction between the gettering material and the fluorochemical lubricant at the first temperature.

29. The method of claim 28, wherein the gettering material comprises of anhydrides of inorganic acids, phosphoric acid, reducing agents, hydride bases, alkali metals, alkali metal alloys, reactive metals, reactive metal hydrides, inorganic salts, or zeolite molecular sieves.

30. The method of claim 27, wherein the polymer encapsulant comprises high-density polyethylene (HDPE), polypropylene (PP), polystyrene (PS), hydrocarbon polymer, hydrocarbon waxes, rubber, or polyamides.

31. The method of claim 27, wherein the fluorochemical lubricant comprises perfluorinated alkyl or perfluorinated polyalkylene oxide tail, and a polar head group.

32. The method of claim 27, wherein the first temperature is within a range of 20-80° C., and the second temperature is above the first temperature.

\* \* \* \* \*